United States Patent [19]

Eckton, Jr. et al.

[11] 4,040,078
[45] Aug. 2, 1977

[54] OPTO-ISOLATORS AND METHOD OF MANUFACTURE

[75] Inventors: Wallace Henry Eckton, Jr.; Phillip Edward Fraley, both of Reading, Pa.

[73] Assignee: Bell Telephone Laboratories, Incorporated, Murray Hill, N.J.

[21] Appl. No.: 685,396

[22] Filed: May 11, 1976

[51] Int. Cl.² .......................................... H01L 27/14
[52] U.S. Cl. ....................................... 357/30; 357/55; 357/19; 250/211 J; 250/551; 29/599
[58] Field of Search ............................. 357/19, 30, 55; 250/551, 211 J

[56] References Cited

U.S. PATENT DOCUMENTS

| | | | |
|---|---|---|---|
| 3,319,068 | 5/1967 | Beale et al. | 250/217 |
| 3,370,174 | 2/1968 | Toussaint | 250/211 |
| 3,480,783 | 11/1969 | Mankarious | 250/211 |
| 3,636,358 | 1/1972 | Grosqburtz | 250/211 J |
| 3,639,770 | 2/1972 | Zizelmann | 250/218 |
| 3,699,407 | 10/1972 | Gertler | 317/235 R |
| 3,845,318 | 10/1974 | Thillays | 250/551 |
| 3,914,137 | 10/1975 | Huffman | 148/175 |
| 3,975,751 | 8/1976 | Springthorpe | 357/19 |

Primary Examiner—Martin H. Edlow
Attorney, Agent, or Firm—Lester H. Birnbaum

[57] ABSTRACT

Opto-isolators are disclosed which provide enhanced coupling between the light-emitting element and detector, and a method of manufacture is taught which permits efficient mass production of such devices. Recesses are etched in a silicon body and areas of the proper conductivity type are formed in the side walls to produce diodes, transistors or darlington pairs for light detection. Appropriate insulation and leads are then fabricated in the recesses to make contact to the detectors. In one embodiment, bonding pads are also formed at the bottom of the recesses along with associated conductors. Light emitting elements are then bonded to the pads on one major surface of the elements and wire bonded on the other major surfaces. The recesses are filled with an encapsulating material and the silicon body is etched apart to produce discrete devices.

In a further embodiment, the light-emitting elements are formed on an insulating board, encapsulated, and the board placed over the silicon body so that the elements project into the recesses. The body may then be etched apart to form discrete devices or isolation regions may be formed to produce a matrix array.

28 Claims, 12 Drawing Figures

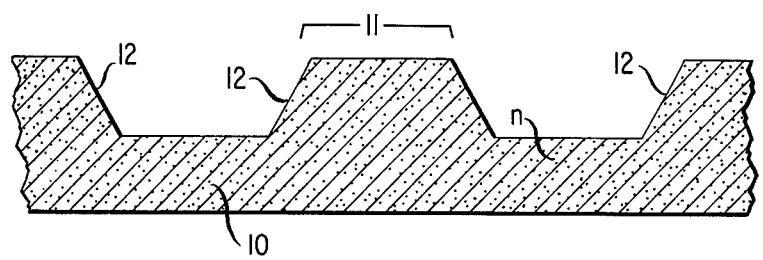
FIG. IA
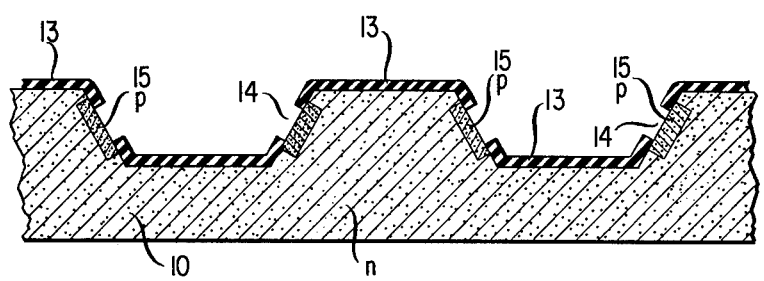
FIG. IB
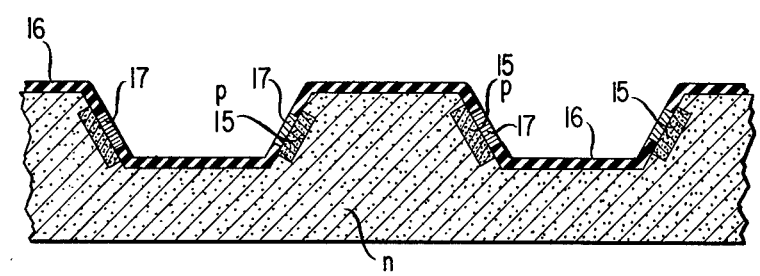
FIG. IC
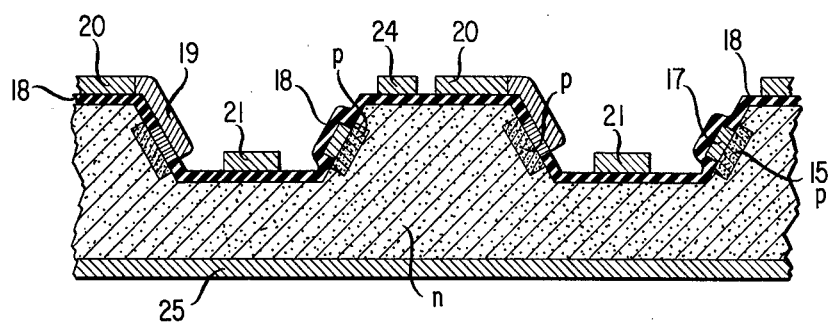
FIG. ID
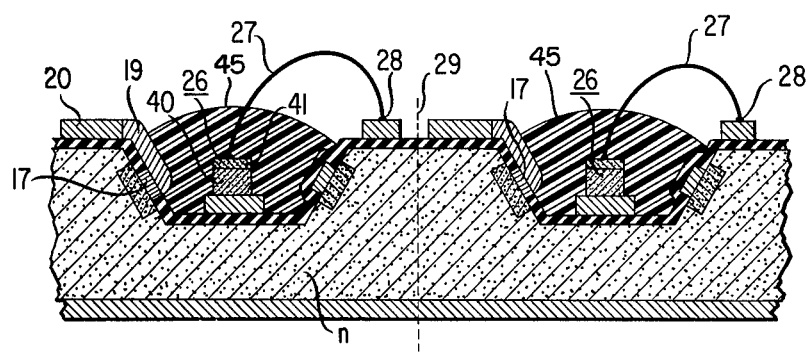
FIG. IE

OPTO-ISOLATORS AND METHOD OF MANUFACTURE

BACKGROUND OF THE INVENTION

This invention relates to opto-isolators with enhanced optical coupling, and a method of manufacturing, such devices.

Optical coupling devices, known in the art as "opto-isolators" are used in a variety of circuit applications where it is desired to electrically isolate input and output circuits. For example, such devices may be used as switches and for transmitting analog signals.

The opto-isolator basically comprises a light-emitting element, such as a GaP light-emitting diode, in combination with a poto-detector such as a silicon diode, transistor, or darlington pair. The prior art method of fabrication usually involves forming the light-emitting diode and detector as discrete elements, bonding the elements to separate lead frames, and then positioning the lead frames so that the elements are in close proximity. The elements are then encapsulated, and the lead frames cut apart to form discrete four lead devices (see, for example, U.S. Pat. No. 3,660,669 issued to Grenon). This is, in general, a satisfactory method of manufacture. However, it is desirable in mass production to provide for a more efficient means of assembling the devices. Further, in such prior art devices, the light-emitting element and photodetector are placed face-to-face or side-to-side, and since the GaP device emits light from all surfaces, such a structure does not utilize all of the light emitted. Thus, it is also desirable to provide a structure with enhanced optical coupling between light emitter and detector.

SUMMARY OF THE INVENTION

These and other objectives are achieved in accordance with the invention. A plurality of recesses are formed in a silicon semiconductor wafer. Photodetectors are produced in the side walls of the recesses by diffusion or ion-implantation of impurities, followed by formation of conductors and insulation in order to provide electrical contact to the detectors. In accordance with a first embodiment, bonding pads and associated conductors are also formed in the recesses. Light-emitting diodes are then bonded to the pads on one surface and wire bonded on the opposite surface. The recesses are filled with an encapsulant, and the wafer is etched apart to produce discrete devices. In accordance with a second embodiment, the light-emitting diodes are bonded to a ceramic board and encapsulated. The board is placed over the silicon wafer after the detectors are formed so that the diodes extend into the recesses. The wafer may then be etched apart or isolation regions formed in the wafer to provide an integrated array of opto-isolators.

The opto-isolators thus formed have the light-emitting elements surrounded by photodetectors, thereby providing enhanced optical coupling.

BRIEF DESCRIPTION OF THE DRAWING

These and other features of the invention are delineated in detail in the following description. In the drawing:

FIGS. 1A-1E are cross-sectional views of a portion of a wafer during various stages of manufacture in accordance with one embodiment of the invention;

It should be realized that for purposes of illustration these FIGURES are not drawn to scale.

DETAILED DESCRIPTION OF THE INVENTION

The method and structure in accordance with one embodiment of the invention will now be described with reference to the various stages of manufacture shown in FIGS. 1A-1E and 2A-2E. FIGS. 1A-1E illustrate in cross-section the fabrication of two opto-isolators from a single wafer which would include many more devices, while FIGS. 2A-2E give a perspective view of the fabrication of one opto-isolator from the wafer.

Figure 2A:
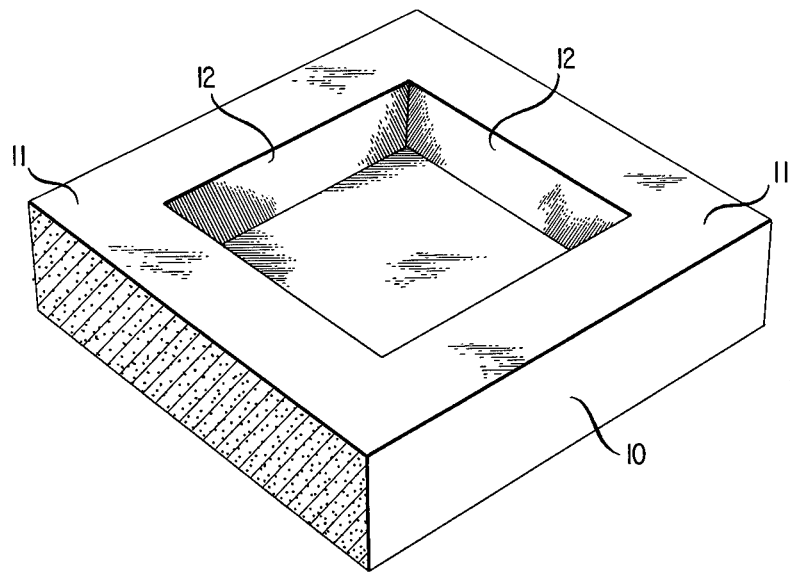
FIGS. 2A-2E are perspective views of a portion of the same wafer during various stages of manufacture in accordance with the same embodiment.

As shown in FIGS. 1A and 2A, the wafer utilized is a silicon semiconductor, 10, which is illustratively n-type conductivity. Of course, the wafer may also be p-type conductivity in which case all polarities to be described would be reversed.

The first step in the process is to form recesses, 11, in the surface of the wafer. This can be accomplished by many methods known in the art. For example, a photoresist layer may be deposited on the surface, exposed to light, and developed so that the areas where the recesses are to be formed are exposed while the remaining areas are protected by the photoresist. The silicon can then be etched by applying an etchant such as hydrazine. Preferably, the silicon wafer is oriented in the <100> direction so that the etching will produce side walls, 12, at an angle of approximately 55° with the surface.

Figure 2B:
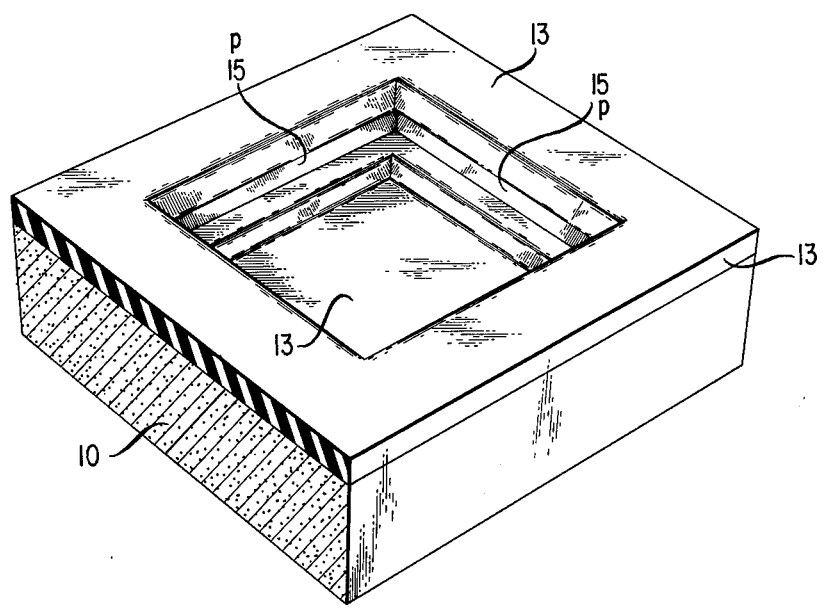
Figure 2C:
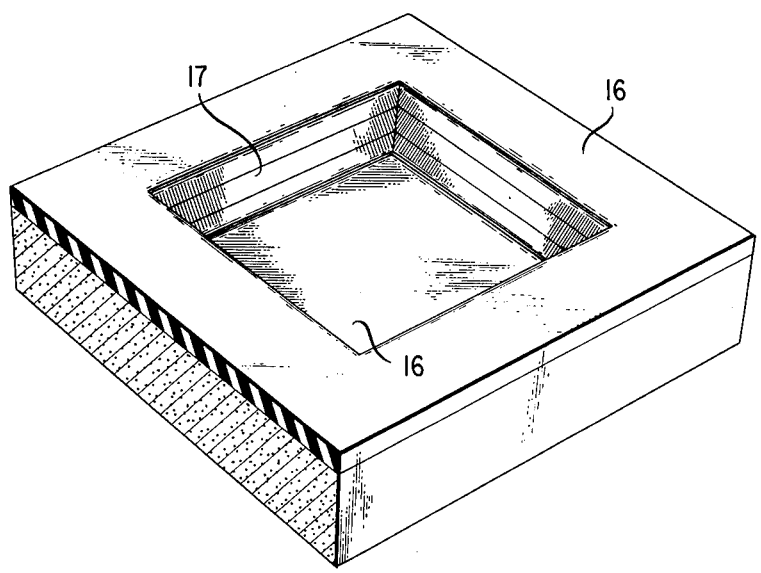

The next step is to form insulating material such as $SiO_2$ over the entire surface of the wafer including the sides and bottoms of the recess. As shown in FIGS. 1B and 2B, the oxides layer, 13, is patterned to produce openings, 14, where it is desired to form regions of opposite conductivity type in the semiconductor. This can be accomplished, again, by standard photolithographic techniques. It will be observed that the opening in each recess is in the form of a band extending along all four side walls of the recess. The oxide should be formed to a sufficient thickness to act as a mask in the subsequent definition of the opposite conductivity regions.

The p-type conductivity regions 15 are then formed as shown on the surface of all four side walls of the recesses. This can be accomplished, for example, by standard diffusion of boron or other p-type impurities into the surface which is not covered by the oxide mask. Alternatively, the regions may be formed by ion implantation of the impurities. Both of these techniques are wellknown in the art and are therefore not discussed in further detail.

As a result of the formation of these p-regions, a photo-diode which is capable of converting light incident thereon into an electrical signal is produced in the side walls of each recess. For an efficient photo-detector, the doping density of the $p$ regions is preferably in the range $8 \times 10^{17} - 2 \times 10^{18} cm^3$ with an n-type silicon body having a doping density of $4 - 6 \times 10^{14} cm^3$. It will be appreciated, as well known in the art, that photo-transistors or darlington pairs may also be produced to provide the same function.

The next sequence of events involves fabrication of the necessary contacts and conductor metallization for both the photodetector and light-emitting diode. Therefore, a new oxide pattern is formed in order to define contacts to the p-regions 15. This may be accomplished by stripping off oxide 13 and regrowing new oxide, or by simply growing additional oxide over the surface including the areas of windows 14. This new oxide is shown as 16 in FIGS. 1C and 2C. Again, windows are opened in the oxide by photolithographic techniques, but this time to define the contact areas for the p-regions 15. Contact metal, 17, is then formed on the surface not covered by the oxide in the form of a band extending along the four side walls of the recesses. Typically, this metal is a Pt-Si alloy.

Figure 2D:
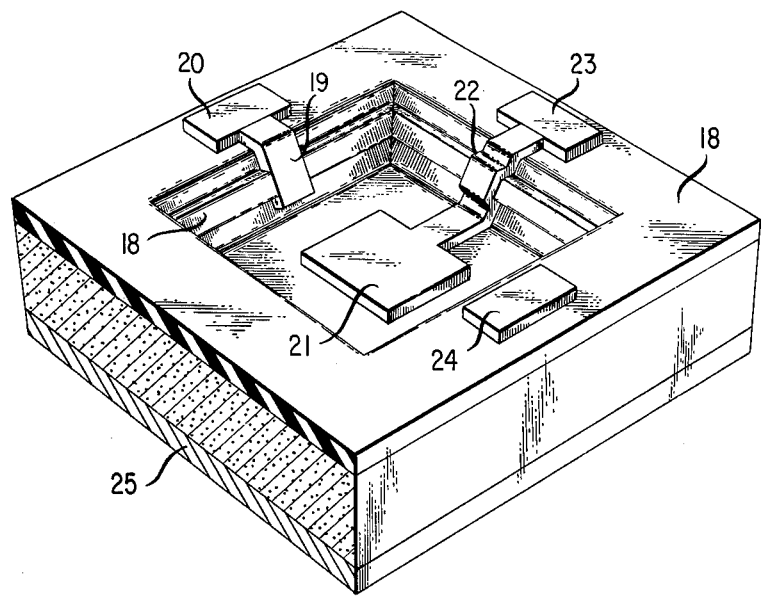

Next, as shown in FIGS. 1D and 2D, the bonding pads and conductor metallization are formed. Again, a new oxide pattern is formed and the windows are defined by standard photolithographic techniques. Metallization is then deposited over the oxide by means of an appropriate mask. Deposition may be by evaporation, plating, or other processes well-known in the art. The metallization is typically successive layers of titanium, palladium and gold according to standard techniques, but other metallizations may be employed. As shown, contact is made to the p-regions, 15, through contacts 17 by means of conductors 19 which terminate in contact pads 20 on the top surface of the silicon wafer. During the same metal deposition, bonding pads 21 are formed on the bottom of the recesses. Coupled thereto are conductors 22 which terminate in pads 23 on the top surface of the wafer. (The latter elements are shown only in FIG. 2D.) Also formed on the top surface of the wafer are bonding pads 24 (see FIGS. 1D and 2D). The metallization 21-22-23 is provided for electrical contact to one surface of the light-emitting diode to be inserted, while pad 24 permits wire bonding to the other side of the diode. It will be appreciated that conductor 22 is insulated from contact metal 17 by oxide layer 18 since electrical isolation between the light emitter and photodetector must be maintained. In order to enchance this isolation it may be desirable to form a layer of silicon nitride over the oxide layer. It is expected that a minimum thickness of insulator to achieve such isolation where the potential difference is 100 volts is approximately 1,000 A. For silicon dioxide alone, a minimum thickness is approximately 2,000 A.

It will be appreciated that this particular pattern of metallization is merely illustrative, and such metal may be deposited in a variety of patterns as long as contact is made to the appropriate regions and pads are formed on the top surface of the wafer for final connection to headers or other circuit elements.

A continuous metal layer, 25, is also formed on the opposite surface of the wafer to provide electrical connection to the n-type portion of the wafer. This metal layer is typically nickel.

Figure 2E:
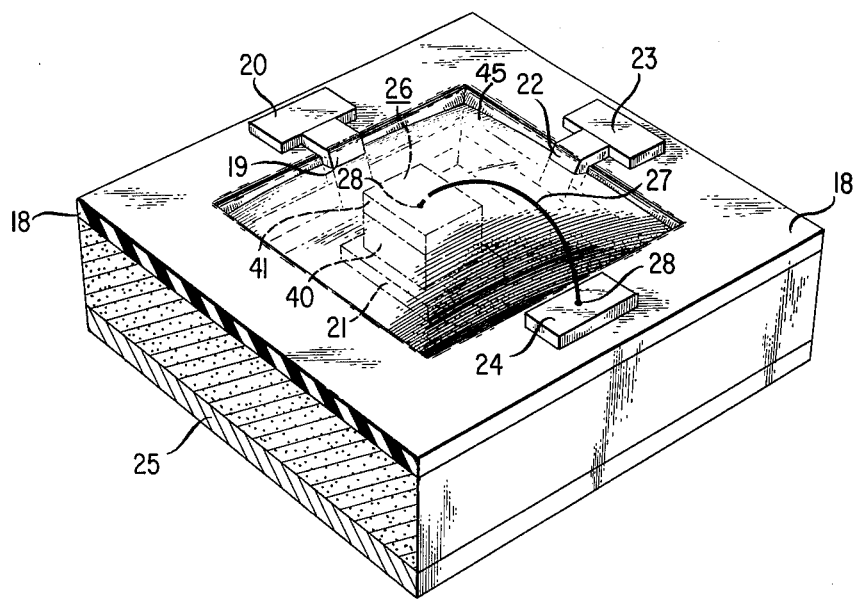
Figure 3:
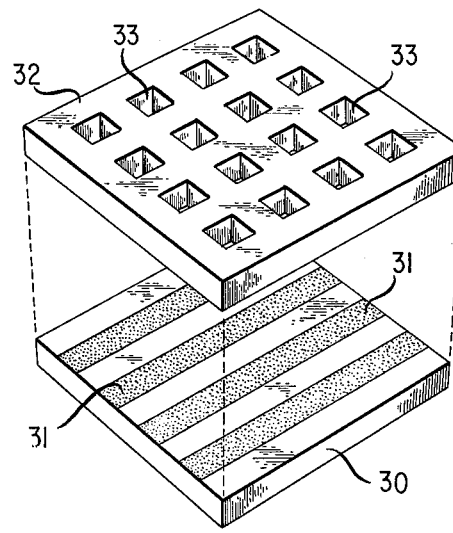
FIG. 3 is a perspective view of apparatus which may be used in the manufacture of the same embodiment.

The next step involves bonding the light- emitting diodes onto the bonding pads of their respective recesses. One convenient method of aligning the individual diodes with their respective recesses utilizes the apparatus of FIG. 3. A body, 30, includes a plurality of striped magnets, 31, on the surface thereof, with the number of stripes corresponding to the number of rows or columns of recesses in the wafer. A mask, 32, which includes holes 33 in the precise pattern of the recesses in the wafer and slightly larger than the area of the recesses, is placed over the body 30. A plurality of light-emitting diodes (not shown) each have iron evaporated on one side. These diodes are dumped on the mask 32 and the apparatus is shaken so that each hole in the mask is filled with a diode which is secured to the body, 30, as a result of magnetic attraction. When the mask is lifted, therefore, the diodes reside on the body 30 in precise alignment with the recesses of the substrate. The diodes may then be picked up a row at a time by vacuum chucks and deposited in their respective recesses. As shown in FIGS. 1E and 2E, a standard GaP diode, 26, comprises an n-type body, 40, upon which is formed a p-type layer 41. The n-type body typically has a doping concentration of approximately $6 \times 10^{17}/cm^3$ while the p-type body is doped with a concentration of approximately $2 \times 10^{17}/cm^3$.

Prior to placing the diodes on the bonding pads 21, a standard metal epoxy bonding material such as that sold under the tradename Ablestik 36-2 is applied to the pads. After the diodes (26) are positioned on the pads, the epoxy is cured, typically at about 150°C for approximately 30 minutes. Thus, the bottom surface of each diode (n-type region) is contacted by the bonding pad 21, conductor 22 and pad 23. The top surface (p-type region) is then contacted to pad 24 by a wire 27 which is secured to the diode and pad by means of epoxy dots 28.

The light-emitting diodes are then encapsulated by filling the recesses with a clear encapsulant, 45, such as that sold under the tradename Hysol C74 as seen in FIGS. 1E and 2E. Following this, the wafer is then sawed or etched apart to produce discrete devices. Broken line 29 of FIG. 1E indicates the etch line for the portion of the wafer shown, and FIG. 2E illustrates a final device. These devices can then be bonded to headers or other surfaces. Alternatively, beam leads may be formed on the top surface of the wafer and extending over the ends of the wafer instead of the contact pads shown.

It will be appreciated that many alternatives falling within the inventive method may be utilized. For example, it appears possible to form the photodiodes by providing a surface region or opposite conductivity type along the entire top surface of the wafer and then etching the recesses through this layer so that the bands of opposite conductivity regions (which extend to the surface) are formed without the necessity or diffusing into the side walls. (See, for example, U.S. Pat. No. 3,883,948 issued to Allison.) Further, although a GaP diode has been shown as the emitter, other III-V semiconductor light- emitting devices may be employed such as GaAs, GaAlAs and GaAsP devices.

Figure 4:
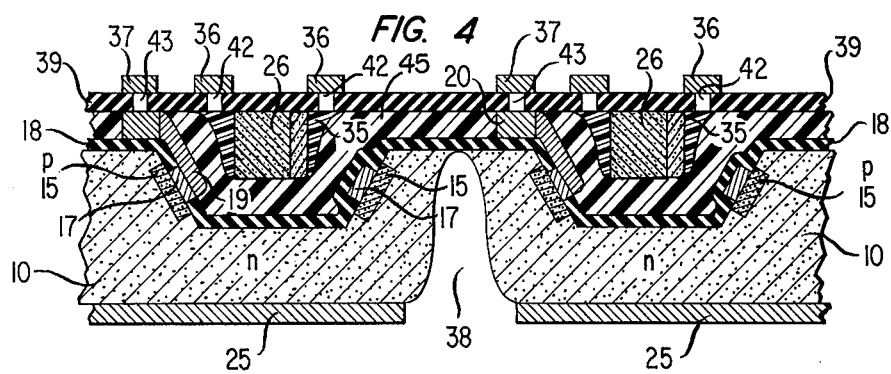
FIG. 4 is a cross-sectional view of a portion of a structure in accordance with a further embodiment of the invention.

A cross-sectional view of a portion of a wafer in accordance with a further embodiment of the invention is presented in FIG. 4. Elements corresponding to those shown in FIGS. 1A-1E and 2A-2E are similarly numbered. The recesses, p-type regions, 15, insulating layer, 18, contacts 17, metallization 19, and pads 20 may be fabricated in accordance with the previous embodiment. Rather than bonding the light-emitting diodes 26 in the recesses, however, they are bonded to an insulating board 39 such as a ceramic material in an array corresponding to the array of recesses in the wafer. As shown, the diodes are bonded on their side faces so that conductive epoxy 35 which can be that sold under the tradename Ablestik 36-2 is applied to the top (p-type region) and bottom (n-type region) surfaces in order to make electrical contact to the diode as well as bond it to the board. The epoxy, in turn, makes contact to the pads 36 of metallization formed on the other side of the board through via holes 42. In addition, via holes 43 are formed through the board so that electrical contact can be made between pads 37 of metallization and the conductors 19 coupled to the p-regions 15. The formation of via holes and metal pads on the board is done according to standard technology.

As shown, the board 39 is placed over the wafer, 10, and bonded to the metal pads 20 so that the light-emitting diodes extend into their respective recesses. Then, air isolation regions, 38, may be etched in the wafer so as to form an integrated array of opto-isolators. Alternatively, the wafer and insulating board may be etched completely through so that discrete devices are formed as in the previous embodiment. Electrical contact can be made to outside elements by means of pads 36 and 37 on the insulating board. A further alternative to this embodiment would be to etch the silicon wafer to the board and apply a glass layer to the bottom surface of the wafer which would fill the isolation holes 38. This could give a better isolation between elements.

Various additional modifications will become apparent to those skilled in the art. All such variations which basically rely on the teachings through which the invention has advanced the art are propertly considered within the spirit and scope of the invention.

What is claimed is:

1. An opto-isolator comprising:
   a silicon body of one conductivity type with a recess having side walls and a bottom surface formed in the top surface of the body;
   means formed in said side walls for detection of light;
   a light-emitting element comprising a III-V semiconductor material with one surface of said element bonded to a first metal pad on the bottom of the recess so that the light emitted therefrom can be detected by said means; and
   means for making electrical contact to said surface of the element comprising metallization extending from the metal pad and terminating on the top surface of said silicon body outside of said recess.

2. The device according to claim 1 wherein the means for light detection comprises a photo-diode comprising a region of conductivity type opposite to said silicon body formed in the side walls of said recess.

3. The device according to claim 1 wherein the light-emitting element comprises a GaP light-emitting diode.

4. The device according to claim 1 wherein the recess is filled with a clear encapsulating material.

5. The device according to claim 1 wherein electrical contact is made to said detection means by metallization formed along the side walls and terminating on the top surface of said silicon body outside of said recess.

6. The device according to claim 1 wherein electrical contact is made to the opposite surface of said element by a wire coupled to said opposite surface and coupled to a second metal pad on the top surface of said silicon body.

7. An opto-isolator comprising:
   a silicon body of one conductivity type with a recess having side walls and a bottom surface formed in the top surface of the body;
   means formed in said side walls for detection of light; and
   a light-emitting element comprising a III-V semiconductor material bonded to a major surface of an insulating board placed over the top surface of the silicon body such that the light-emitting element extends into said recess so that the light emitted therefrom can be detected by said means.

8. The device according to claim 7 wherein the light-emitting element is bonded to said board by a conductive epoxy, and said board further includes metal pads formed on the opposite major surface of said board which make electrical contact to said epoxy through holes formed in the board.

9. The device according to claim 7 wherein the means for light detection comprises a photo-diode comprising a region of conductivity type opposite to said silicon body formed in the side walls of the recess.

10. The device according to claim 7 wherein the light-emitting element comprises a GaP light-emitting diode.

11. The device according to claim 7 wherein the recess is filled with a clear encapsulating material.

12. The device according to claim 7 wherein electrical contact is made to said detection means by metallization formed along the side walls and terminating on the top surface of said silicon body outside of said recess.

13. An opto-isolator comprising:
   a silicon body of one conductivity type with a recess having side walls and a bottom surface formed in the top surface of the body;
   means formed in said side walls for detection of light comprising a region of conductivity type opposite to said body extending along the side walls;
   means for making electrical contact to said detection means comprising a first metallization formed along the side walls in contact with said region of opposite conductivity type and terminating outside of said recess on the top surface of said body;
   a light-emitting element comprising III-V semiconductor with one surface bonded to a first metal pad formed on the bottom of the recess and insulated from the silicon body;
   means for making electrical contact to said surface of said element comprising a second metallization extending from the first pad to a second pad located outside of said recess on the top surface of the silicon body, said second metallization being insulated from said silicon body and insulated from said first metallization;
   means for making electrical contact to the opposite surface of said element comprising a wire coupled to said surface and to a second metal pad formed outside said recess on the top surface of the silicon body; and
   a clear encapsulating material formed in said recess covering said light-emitting element.

14. An opto-isolator comprising:
   a silicon body of one conductivity type with a recess having side walls and a bottom surface formed in the top surface of said body,
   means formed in said side walls for detection of light comprising a region of conductivity type opposite to said body extending along the side walls;
   means for making electrical contact to said detection means comprising a first metallization formed along the side walls in contact with said region of opposite conductivity type and terminating outside of said recess on the top surface of said body;

an insulating board place over the top surface of said silicon body, said board including metal pads on the surface opposite to said silicon body and holes formed through said board;

a light-emitting element comprising a III-V semiconductor which is bonded to the surface of said board facing said silicon body by a conductive epoxy in contact with two opposite surfaces of said element such that the light-emitting element extends into said recess and electrical contact is made to the opposite surfaces of said element by the metal pads through the holes in the board.

15. A method of forming opto-isolators comprising the steps of:

forming a plurality of recesses having side walls and a bottom surface in the top surface of a silicon body of one conductivity type;

forming in each of said side walls means for detecting light;

forming first metal pads on the bottom of the recesses;

depositing metallization extending from the pads and terminating outside of the recesses on the top surface of the silicon body; and placing within each recess a light-emitting element comprising a III-V semiconductor material with one major surface of the light-emitting elements bonded to an associated metal pad such that the light emitted therefrom can be detected by said means.

16. The method according to claim 15 further comprising the step of separating the resulting structure so as to form discrete opto-isolators.

17. The method according to claim 15 wherein the means for light detection are formed by forming regions of conductivity type opposite to the said semiconductor in the side walls of the recesses.

18. The method according to claim 15 further comprising the step of filling the recesses with a clear encapsulating material.

19. The method according to claim 15 wherein electrical contact is made to said detection means by depositing metallization along the side walls terminating outside of the recesses on the top surface of the silicon body.

20. The method according to claim 15 wherein the opposite major surface of each light-emitting element is coupled to a wire which is coupled to an associated second metal pad formed on the top surface of the silicon body outside of the recesses.

21. A method of forming opto-isolators comprising the steps of:

forming a plurality of recesses having side walls and a bottom surface in the top surface of a silicon body of one conductivity type;

forming in each of said side walls means for detecting light; and placing over the top surface of the silicon body an insulating board with a plurality of light-emitting elements comprising a III-V semiconductor material bonded thereto such that the light-emitting elements extend into an associated recess and light emitted therefrom can be detected by said means.

22. The method according to claim 21 further comprising the step of separating the resulting structure so as to form discrete opto-isolators.

23. The method according to claim 21 wherein the means for light detection are formed by forming regions of conductivity type opposite to the silicon body in the side walls of the recesses.

24. The method according to claim 21 further comprising the step of filling the recesses with a clear encapsulating material.

25. The method according to claim 21 wherein electrical contact is made to said detection means by depositing metallization along the side walls terminating outside of the recesses on the top surface of the silicon body.

26. The method according to claim 21 wherein metal pads are deposited on the opposite major surface of the insulating board and the light-emitting elements are bonded to the board by a conductive epoxy which makes electrical contact to associated pads through holes formed through the board.

27. A method of forming opto-isolators comprising the steps of:

forming a plurality of recesses each having side walls and a bottom surface in the top surface of a silicon body of one conductivity type;

forming in each of said side walls means for detecting light comprising regions of opposite conductivity type to the silicon body;

providing electrical contact to said detection means by depositing first metallization patterns along the side walls in contact with said regions of opposite conductivity type and terminating outside of said recesses on the top surface of the silicon body;

depositing first metal pads on the bottom of each recess and second metal pads on the top surface insulated from said silicon body;

depositing second metallization patterns extending from the first pads and terminating outside of the recesses on the top of the silicon body, said second metallization being insulated from said first metallization and from said silicon body;

bonding one major surface of a light-emitting element comprising a III-V semiconductor material on each of said first metal pads;

contacting the opposite major surface of each light-emitting element with a wire which is coupled to a respective second metal pad; and filling said recesses with a clear encapsulating material.

28. A method of forming opto-isolators comprising the steps of:

forming a plurality of recesses each having side walls and a bottom surface in the top surface of a silicon body of one conductivity type;

forming in each of said side walls means for detecting light comprising regions of opposite conductivity type to the silicon body;

providing electrical contact to said detection means by depositing first metallization patterns along the side walls in contact with said regions of opposite conductivity type and terminating outside of said recesses on the top surface of the silicon body; and placing over the top surface of said silicon body an insulating board which includes one major surface a plurality of light-emitting elements comprising a III-V semiconductor material, each bonded thereto by a conductive epoxy, such that the light-emitting elements extend into the recesses, and wherein said board includes metal pads formed on the opposite major surface which make electrical contact to said epoxy through holes formed through the board.

* * * * *